US006592195B2

(12) United States Patent
Butterbaugh et al.

(10) Patent No.: US 6,592,195 B2
(45) Date of Patent: Jul. 15, 2003

(54) COMBINATION COMPUTER ACCESS COVER AND COMPONENT REMOVAL TOOL

(75) Inventors: Matthew Allen Butterbaugh, Rochester, MN (US); Don Alan Gilliland, Rochester, MN (US); James Larry Peacock, Aloha, OR (US)

(73) Assignee: International Business Machines Corporation, Armonk, NY (US)

( * ) Notice: Subject to any disclaimer, the term of this patent is extended or adjusted under 35 U.S.C. 154(b) by 78 days.

(21) Appl. No.: 09/751,532

(22) Filed: Dec. 29, 2000

(65) Prior Publication Data

US 2002/0084733 A1 Jul. 4, 2002

(51) Int. Cl.[7] .............................. A47B 96/00; H05K 7/14
(52) U.S. Cl. ..................... 312/293.3; 361/798; 361/801; 439/157; 439/923
(58) Field of Search ................................. 361/801, 752, 361/754, 798, 796; 439/153, 159, 157, 160, 923; 174/66, 67; 312/223.1, 237, 293.2

(56) References Cited

U.S. PATENT DOCUMENTS

| | | | | | |
|---|---|---|---|---|---|
| 3,181,906 A | * | 5/1965 | De Rose et al. | ............... | 294/16 |
| 3,193,316 A | * | 7/1965 | Custer | ............... | 294/15 |
| 3,577,113 A | * | 5/1971 | Maitland | ............... | 439/64 |
| 3,583,744 A | * | 6/1971 | Paine et al. | ............... | 294/15 |
| 4,301,494 A | * | 11/1981 | Jordan | ............... | 361/798 |
| 4,778,401 A | * | 10/1988 | Boudreau et al. | ............... | 439/153 |
| 5,265,328 A | * | 11/1993 | Gorman | ............... | 29/829 |
| 5,268,821 A | * | 12/1993 | Wong | ............... | 361/796 |
| 5,319,524 A | * | 6/1994 | Welch et al. | ............... | 361/754 |
| 5,463,532 A | * | 10/1995 | Petitpierre et al. | ............... | 361/800 |
| 5,783,777 A | * | 7/1998 | Kruse et al. | ............... | 174/66 |
| 6,147,878 A | * | 11/2000 | Heselton | ............... | 361/798 |
| 6,441,304 B1 | * | 8/2002 | Currier et al. | ............... | 174/53 |

* cited by examiner

Primary Examiner—Lanna Mai
Assistant Examiner—Jerry A. Anderson
(74) Attorney, Agent, or Firm—Wood, Herron & Evans, LLP

(57) ABSTRACT

A cover is operable to seat and unseat electronic components. The cover is detached from an enclosure exposing an access opening. An electronic component, such as an expansion card, is inserted by an operator into guide rails housed within the opening. A first catch mechanism of the cover pivotally engages the opening so as to form a lever arm. A second catch mechanism connects with a mating catch of the electronic component. The component traverses the guide rails according to the rotation of the cover. The mechanical advantage realized by the cover overcomes the forces associated with seating and detaching connector pins of the electronic component with sockets of an expansion bus. The cover detaches from both the component and the enclosure prior to being repositioned to overlap the opening.

21 Claims, 3 Drawing Sheets

COMBINATION COMPUTER ACCESS COVER AND COMPONENT REMOVAL TOOL

FIELD OF THE INVENTION

The present invention relates generally to computer hardware maintenance, and more particularly, to access covers for use in inhibiting access to electronic components housed within an enclosure and removal tools for use in assisting in the removal of electronic components from an enclosure.

BACKGROUND OF THE INVENTION

Computer enclosures generally have open cavities for housing structures that seat removable electronic components such as expansion cards. Expansion cards are commonly used to increase audio, communications, graphics and processing capabilities of systems. Cards are typically thin, rectangular printed circuit boards that have connector pins along one edge. The pins are coupled to corresponding sockets of an expansion bus. Expansion buses, such as a Peripheral Component Interconnect or Industry Standard Architecture buses, are electrically coupled to main system circuit boards.

With expansion cards that have small numbers of connector pins, users may be capable of manually seating and unseating cards. However, some expansion cards can have as many as several hundred connector pins that must be seated. Such a task often requires tools that are especially designed to overcome the forces associated with connector pin insertion and removal. Thus, a single seating or unseating process often requires an operator to have numerous tools on hand, including many that are expensive, awkward and easily misplaced. Also, forces applied to an expansion card during insertion or removal may be unevenly distributed across the card edge due to a misalignment of the tool, expansion card and/or connector bus. Uneven forces can result in ineffective seating and removal, as well as damage to the expansion card and internal computer hardware.

In addition to insertion/removal tools, a separate device for covering the open cavity is often necessary. The cover device is principally necessary to prevent the escape of electromagnetic noise from the cavity. Uncontained noise interferes with the operation of nearby electronic devices, such as computer monitors. A cover device is also necessary to prevent an operator from unintentionally contacting the load-bearing hardware housed within the cavity. Conversely, the cover protects the contained hardware from dust and other contaminants, as well as from remote electromagnetic noise.

Cover devices often comprise perforated sheet metal panels that block noise emanating from the cavity. Plastic grips on the panel attach to the top and bottom edges of the cavity. Some such devices permanently attach to an expansion card. Much of the electromagnetic noise is impeded by the covers, however, the external plastic grips can introduce gaps in coverage. Even a small gap or seam between the sheet metal and a cavity edge can permit an unacceptable amount of noise to escape. Attempts to ground escaping electromagnetic noise include attaching copper springs to the sheet metal cover. The springs contact the cavity edges, acting to redirect escaping electromagnetic waves. Alternatively, springs originate from the portal and contact the metal sheet. In either case, the manufacture and attachment of copper springs, as well as the plastic grips, represent significant costs and installation challenges.

Therefore a significant need exists for an improved manner of seating and removing an expansion card, as well as for covering the cavity that houses the card.

SUMMARY OF THE INVENTION

The present invention addresses these and other problems associated with the prior art by providing a unique access cover that is removably securable over an access opening of an enclosure, and that, when removed, also functions as a removal tool for use in removing an electronic component accessible through the access opening.

In one embodiment consistent in the invention, a first catch mechanism defined on the cover removably engages the enclosure proximate the access opening. A second catch mechanism defined on the cover is configured to engage the electronic component when the first catch mechanism engages the enclosure. The cover is then capable of functioning as a lever arm when the first catch mechanism engages the enclosure to assist in urging the electronic component towards a disengaged position.

These and other advantages and features that characterize the invention are set forth in the claims annexed hereto and forming a further part hereof. However, for a better understanding of the invention, and of the advantages and objectives attained through its use, reference should be made to the Drawings, and to the accompanying descriptive matter, in which there are described exemplary embodiments of the invention.

The accompanying drawings, which are incorporated in and constitute a part of this specification, illustrate embodiments of the invention and, together with a general description of the invention given above, and the detailed description of the embodiments given below, serve to explain the principles of the invention.

DETAILED DESCRIPTION

Generally, the present invention relates to a system for seating, removing and covering an electronic component, such as an expansion card or tape drive. The system utilizes a cover to overlap an access opening in an enclosure that houses processing hardware. When an electronic component must be installed or removed, an operator detaches the cover, exposing the access opening. A first catch mechanism on a first end of the cover is pivotally mounted to an edge of the access opening. The electronic component is coupled to a second catch mechanism that protrudes from the cover. The cover forms a lever arm that may be reciprocated to cause the component to move either towards or away from access opening. When the component is properly seated, the cover is detached from both the component and the access opening edge, and is again fastened over the opening.

Figure 1:
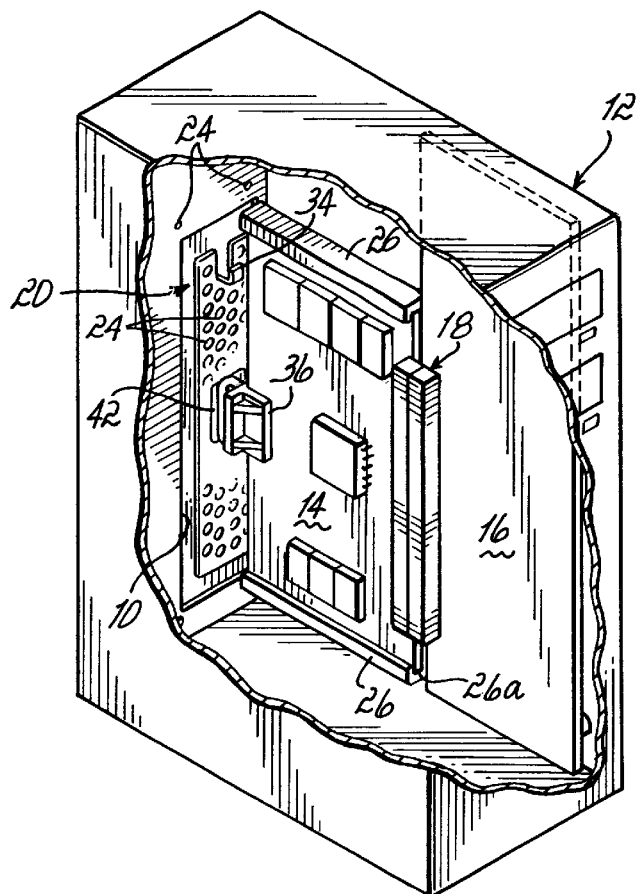
FIG. 1 is a perspective view partially broken away of an exemplary computer enclosure.
Figure 2:
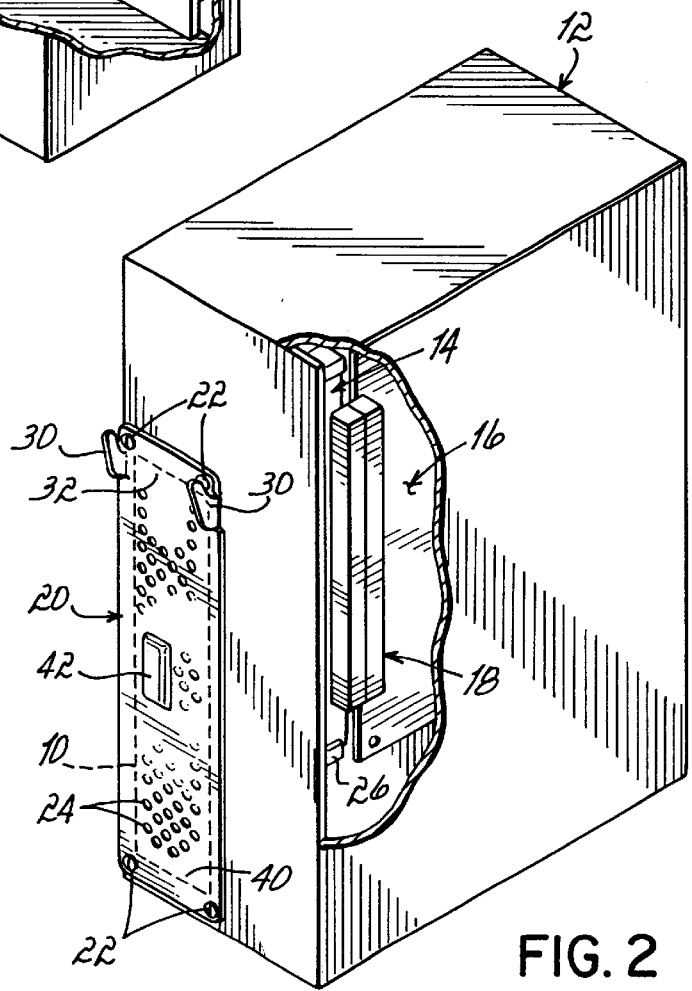
FIG. 2 is a rear perspective view of the enclosure of FIG. 1 having a cover in the closed position that is consistent with one embodiment of the invention positioned over an access opening.

Referring to FIGS. 1 and 2, an access opening 10 of an enclosure 12 facilitates the installation and unseating of an electronic component 14. Exemplary hardware contained within the enclosure includes a system circuit board 16 and an associated connector bus 18. The connector bus 18 acts as a logical bridge communicating the contents of a coupled electronic component 14 to the circuit board 16. During normal operation, a cover 20 overlaps the access opening 10 to prevent the escape of electromagnetic noise from the enclosure 12. The cover 20 is shown in FIG. 2 fastened with four closures 22 that are removed when access to the opening 10 is required. Suitable closures include: screws, hooks, thumb screws, snap connectors, or any mechanism suited to attach surface.

Perforations 24 in the cover 20 allow hot air to flow from the enclosure 12, but are small enough to contain generated electromagnetic noise that could otherwise disrupt nearby processing equipment. Generally, the diameter of the holes 24 are inversely proportional to the processing speed of the circuit board 16. Further, the cover generously overlaps the access opening 10 when fastened. As such, electromagnetic noise emanating from along the edges of the opening 10 is attenuated while traversing overlap region.

Figure 3:
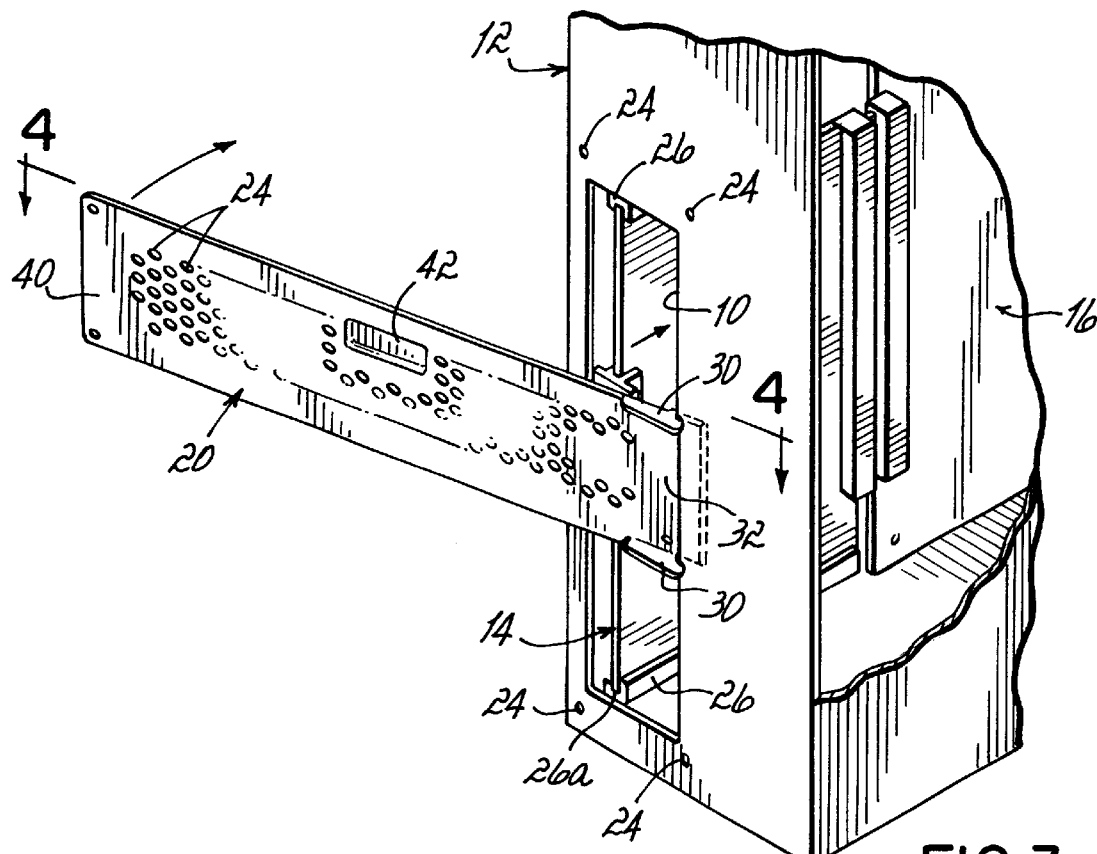
FIG. 3 is a Figure similar to FIG. 2 showing the enclosure in an open position, so as to seat and unseat an electronic component in a manner that is in accordance with the principles of the present invention.
Figure 5:
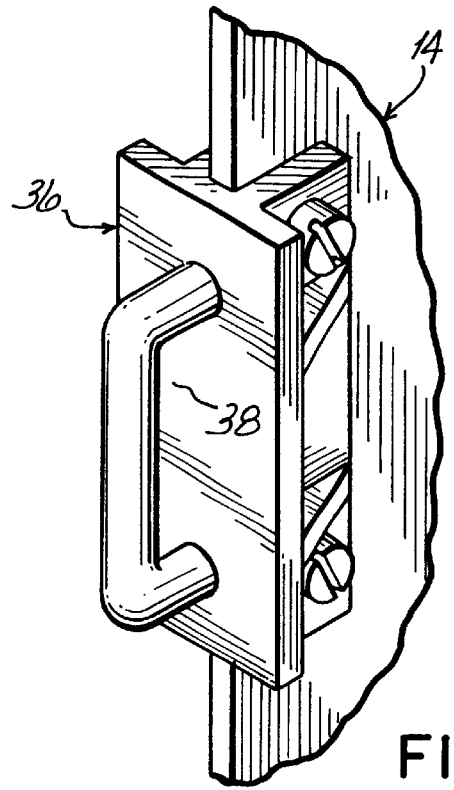
FIG. 5 shows a perspective view of the exemplary cover of FIGS. 2 and 3.
Figure 4:
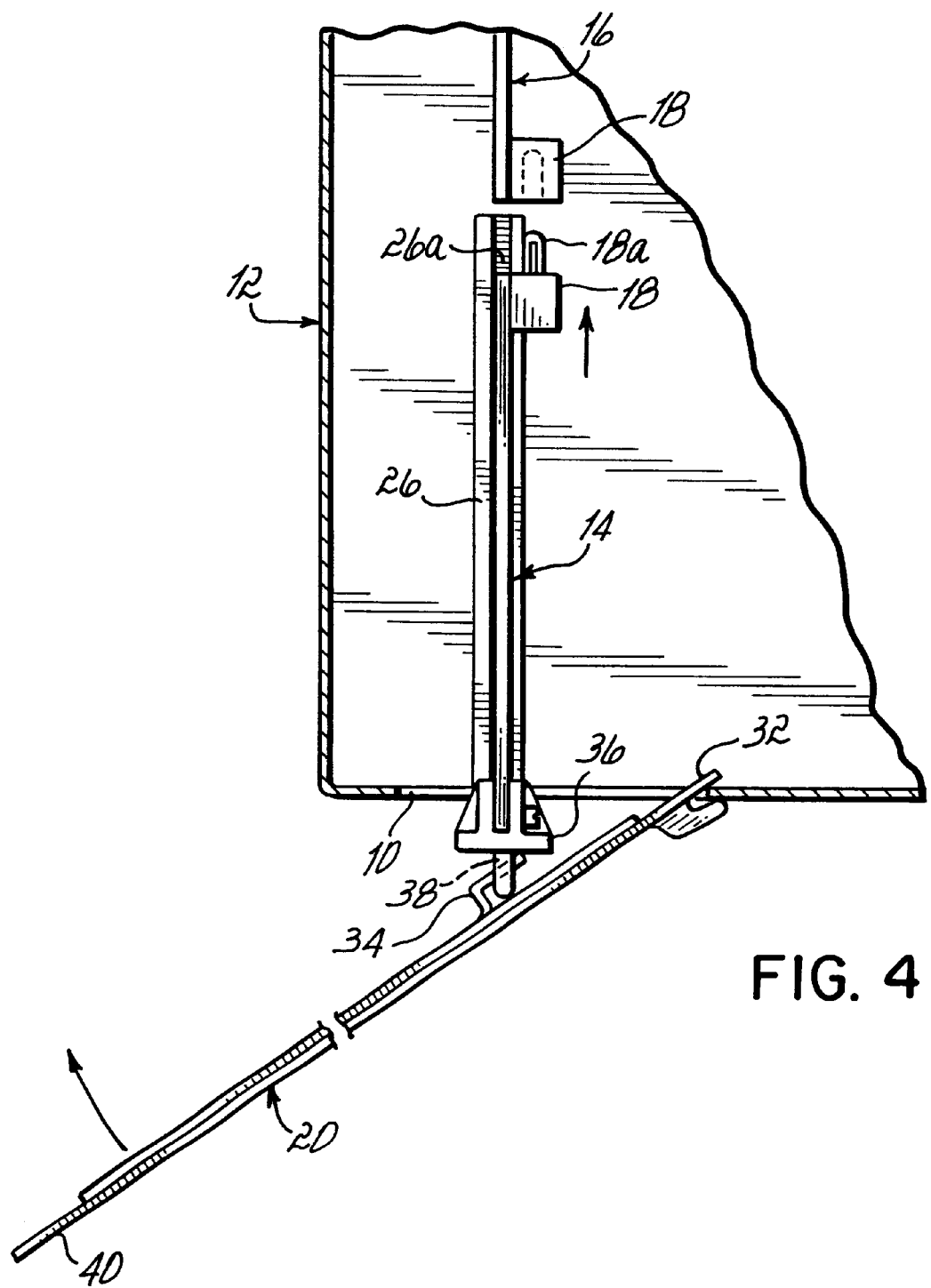
FIG. 4 is a cross-sectional view taken on line 4—4 of FIG. 3 in accordance with the principles of the present invention.

When an expansion card 14 is seated, the cover 20 is detached, and an operator uses their hands to insert the card through the access opening 10 into guide rails 26. The rails 26 are attached to the enclosure 12 and have grooves 26a that allow the electronic component 14 to slide towards the connector bus. As shown in FIGS. 3–5, a first pair of catch mechanism 30 located at a first end 32 of the cover 20 is mounted on the edge of the access opening 10 so as to be pivotable. A second catch mechanism 34 shown as a hook projecting from the rear of the cover 20 is coupled to a mating latch 36 of the electronic compound 14. An exemplary mating latch 36 includes a hollow plastic piece having a slot 38 for accommodating the second catch mechanism 34. The second catch mechanism 34 is inserted into the slot 38, and moves the mating latch 36 when a tangential force is applied to the second end 38 of the cover 20. Although the second catch 34 is shown in the figure as a hook, one skilled in the art will appreciate that any appropriate latching mechanism may alternatively be substituted, such as a ball socket or clamp arrangement.

As the second end 40, or handle portion of the cover 20 is rotated towards the enclosure 12, the electronic component 14 is pushed along the rails 26 until it is adjacent the connector bus 18. The lever arm action of the cover 20 snaps the connector pins 18a of the electronic components 14 into the sockets of the connector bus 18. Significantly, the force communicated to the connector pins is evenly distributed across the electronic component 14 edge due to the alignment of the cover 20, component 14 and bus 18. It should be appreciated that the length of the cover 20 may be exaggerated to achieve increased desired mechanical advantage. Also, the second catch mechanism 34 may be positioned on the cover 20 so that the second end 40 of the cover 20 extends at an angle relative to the enclosure 12 when the electronic component 14 is seated. This feature is advantageous in applications where a hardware protrusion extends outside of the enclosure 12.

Once properly seated, the operator guides the second catch mechanism 34 out of the mating latch 36, and the cover 20 is re-fastened over the access opening 10. A raised portion 42 of the cover 20 protrudes in order to accommodate that portion of the electronic component 14 or mating latch 36 that extends beyond the plane of the access opening 10. The raised portion 42 of the cover 20 slightly contacts the edge of the electronic component when the cover 20 is positioned over the access opening 10. Pressure from the cover 20 secures the electronic component 14 into place and minimizes disconnects and vibrational damage that can occur during shipping.

The process is reversed when the electronic component 14 is powered down and prepared for removal. The cover 20 is unfastened and is again connected to the mating latch 36 of the component 14 and to the edge of the access opening 10 as described above. However, the handle, or second end 40 of the cover 20 is now pivoted away from the access opening 10. The leverage realized by the cover 20 enables the user to detach the connector pins from the sockets. The electronic component 14 travels along the rails 26 towards the access opening 10 as the cover 20 continues to be rotated. The user uncouples the second catch mechanism 34 from the mating latch 36 as before, and the electronic component 14 is guide out of the rails 26 and access opening 10. Finally, the cover 20 is replaced over the access opening 10.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. The invention in its broader aspects is therefore not limited to the specific details, representative apparatus and method, and illustrative example shown and described. Accordingly, departures may be made from such details without departing from the spirit or scope of applicant's general inventive concept.

What is claimed is:

1. A cover for use in covering an access opening in an enclosure through which access is provided to a removable electronic component, the cover comprising:

(a) a body having first and second ends, the body sized and configured to overlap the access opening when the cover is secured to the enclosure.

(b) a first catch mechanism defined on the body and configured to removably engage the enclosure proximate the access opening; and (c) a second catch mechanism defined on the body and configured to engage the removable electronic component when the first catch mechanism engages the enclosure, wherein the body functions as a lever arm when the first catch mechanism engages the enclosure to assist in urging the removable electronic component toward a disengaged or engaged position.

2. The cover of claim 1, wherein the first catch mechanism is configured to pivot about the engaged enclosure.

3. The cover of claim 1, wherein the cover is configured to translate the electronic component according a rotation of the body.

4. The cover of claim 1, wherein the cover is configured to translate an expansion card according to rotation of the body.

5. The cover of claim 1, wherein the first catch mechanism is disposed proximate a first end of the body.

6. The cover of claim 1, wherein the second catch mechanism is disposed intimate the first catch mechanism and a second end of the body.

7. The cover of claim 1, wherein the electronic component has a portion that protrudes beyond a plane of the access opening when the electronic component is seated, and wherein the body is contoured to accommodate the portion of the electronic component that protrudes beyond the plane of the access opening.

8. The cover of claim 1, wherein the cover is configured to be fastened to the enclosure with a closure.

9. The cover of claim 1, wherein the second catch mechanism of the cover is configured to be coupled with a mating latch of the electronic component.

10. The cover of claim 1, wherein the rotation of the body translates the electronic component along a rail, wherein the rail guides the electronic component towards or away from a connector bus, wherein the electronic component is configured to couple with the connector bus.

11. A method for removing an electronic component from an enclosure, comprising:

(a) removing a cover that overlaps an access opening of the enclosure;

(b) engaging the enclosure proximate the access opening with a first catch mechanism of the cover;

(c) engaging the electronic component with a second catch mechanism of the cover; and (d) imparting a moment to the cover to pivot the cover about a pivot axis defined through the first catch mechanism to assist in urging the electronic component toward a disengaged or engaged position.

12. A method for removing an electronic component according to claim 11, further comprising translating the electronic component according to rotation of the cover.

13. A method for removing an electronic component according to claim 11, further comprising fastening the cover to the enclosure with a closure.

14. A method for removing an electronic component according to claim 11, further comprising coupling the second catch mechanism to a mating latch of the electronic component.

15. An apparatus, comprising:

(a) an enclosure including an access opening for use in accessing an electronic component housed within the enclosure; and (b) a cover removably secured to the enclosure and sized and configured to cover the access opening, the access cover further being configured for removal from the enclosure while the electronic component is seated in the enclosure, and for use as a tool for removing the electronic component from the enclosure through the access opening when the cover is removed from the enclosure, wherein the cover is configured to pivot about the enclosure, wherein the cover has a first catch mechanism configured to pivotally engage the enclosure proximate the access opening, and wherein a second catch mechanism is disposed intermediate the first catch mechanism and an end of the cover and is configured to engage the electronic component for removal.

16. The apparatus of claim 15, wherein the enclosure houses a connector bus operable to couple with the electronic component and rails operable to guide the electronic component to the connector bus.

17. The cover of claim 15, wherein the first catch mechanism is disposed proximate an opposite end of the cover.

18. The apparatus according to claim 15, wherein the cover is configured to be secured to the enclosure with a closure.

19. The apparatus according to claim 15, wherein the cover operatively attaches to the electronic component, wherein the second catch mechanism is configured to engage a mating latch of the electronic component.

20. The apparatus according to claim 15, whereby the cover is configured to translate the electronic component according to rotation of the cover.

21. The apparatus according to claim 15, wherein the electronic component has a portion that protrudes beyond a plane of the access opening when the electronic component is seated, and wherein the cover is contoured to accommodate the portion of the electronic component that protrudes beyond the plane of the access opening.

* * * * *